United States Patent
Fujiwara (10) Patent No.: US 6,287,876 B1
(45) Date of Patent: Sep. 11, 2001

(54) RETICLE-SUBSTRATE ALIGNMENT METHODS FOR CHARGED-PARTICLE-BEAM MICROLITHOGRAPHY, AND ASSOCIATED SEMICONDUCTOR-DEVICE MANUFACTURING METHODS

(75) Inventor: Tomoharu Fujiwara, Ageo (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/656,406

(22) Filed: Sep. 6, 2000

(30) Foreign Application Priority Data

Sep. 6, 1999 (JP) .................................................. 11-251293

(51) Int. Cl.$^7$ .................................................. G01R 31/26
(52) U.S. Cl. .............................. 438/4; 438/401; 438/462; 438/800; 257/797; 257/798
(58) Field of Search .................................... 438/4, 14–18, 438/401, 462, 800; 257/797, 798; 250/491.1, 492.2, 492.21, 492.22, 397, 398

(56) References Cited

U.S. PATENT DOCUMENTS 6,204,509 * 3/2001 Yahiro et al. ...................... 250/491.1

FOREIGN PATENT DOCUMENTS

404043627 * 2/1992 (JP) ........................................ 430/296

* cited by examiner

Primary Examiner—Tuan H. Nguyen
Assistant Examiner—Craig Thompson
(74) Attorney, Agent, or Firm—Klarquist Sparkman Campbell Leigh & Whinston, LLP (57) ABSTRACT

Methods are disclosed for performing reticle-substrate alignments in the context of charged-particle-beam (CPB) microlithography. More specifically, the subject methods pertain to detecting an amount of relative rotation between the "transfer-receiving" (e.g., substrate) side and the "transfer-originating" (e.g., reticle) side in one operation simply by detecting marks that are disposed near an axis of the CPB-optical system. A charged particle beam is passed through an alignment mark(s) situated relative to an alignment axis of the reticle and thus indicates reticle orientation. One or more respective index marks are defined on the substrate relative to an alignment axis of the substrate, thereby indicating substrate orientation. E.g., two index marks can be provided on the substrate, one convex and the other concave, but otherwise similarly shaped. The index marks can be situated linearly aligned with each other or at an angle to each other. Production of backscattered charged particles from the index marks is mutually canceling whenever the reticle is oriented exactly with the substrate, but not whenever the reticle and substrate are misoriented. The angle of misalignment can be calculated by analyzing the output pattern of an electrical signal corresponding to detected backscattered charged particles.

18 Claims, 5 Drawing Sheets

RETICLE-SUBSTRATE ALIGNMENT METHODS FOR CHARGED-PARTICLE-BEAM MICROLITHOGRAPHY, AND ASSOCIATED SEMICONDUCTOR-DEVICE MANUFACTURING METHODS

FIELD OF THE INVENTION

This invention pertains to microlithography, which is a key technology used in the fabrication of semiconductor integrated circuits, displays, and the like. More specifically, the invention pertains to projection microlithography performed using a charged particle beam. In charged-particle-beam (CPB) microlithography, a pattern as defined on a "reticle" (also termed a "mask") is projected onto a sensitive substrate (e.g., a semiconductor wafer) using the charged particle beam. Even more specifically, the invention pertains to methods and apparatus, for use in CPB microlithography, in which a relative rotational displacement between the reticle (or reticle stage) and the substrate (or substrate stage) is determined, thereby facilitating reduction of the rotational displacement.

BACKGROUND OF THE INVENTION

With the progressive miniaturization of individual circuit elements in integrated circuits, the resolution limitations of optical microlithography have become increasingly apparent and difficult to overcome. Hence, considerable effort currently is being expended to develop a practical microlithography apparatus that utilizes an energy beam offering prospects of greater resolution than obtainable with optical microlithography. One approach in this regard involves using a charged particle beam (e.g., electron beam or ion beam) instead of a light beam as an energy beam.

Charged-particle-beam (CPB) microlithography methods (and associated apparatus) are of several types. One type involves "direct writing" in which an electron beam "draws" a pattern directly on a substrate (e.g., semiconductor wafer) without using a reticle or mask. Another type, broadly classified as CPB "projection" microlithography, utilizes a reticle (defining a pattern) that is projected onto the substrate using a charged particle beam.

Most current efforts directed to making a practical CPB projection microlithography apparatus concern a partial one-shot approach, also termed a "divided transfer" approach utilizing a "divided-transfer" microlithography apparatus. In the divided-transfer approach, a pattern field on the reticle is divided into portions, termed subfields, and each subfield is exposed individually and thus transferred to the substrate. The entire pattern field defined by the reticle is transferred subfield-by-subfield as the reticle and substrate are moved relative to each other. Under such an exposure scheme, extremely accurate alignment of the reticle and substrate with each other is critical.

Further regarding the partial one-shot approach, the substrate is mounted on a substrate stage and the reticle is mounted on a reticle stage. The stages are movable relative to each other. Accurate alignment of the reticle and substrate, as noted above, requires that the following be executed and controlled extremely accurately: (1) detection of the relative positions of the reticle stage and substrate stage, (2) detection of the relative positions of the reticle and substrate, (3) moving the reticle stage and substrate stage relative to each other, and (4) correcting the positional relationship of the stages, as well as of the reticle and substrate, as required during exposure. Detection and correction of relative positional relationships of the transfer-receiving side (substrate side) and the transfer-originating side (reticle side) are referred to herein as positional "alignments."

Figure 7A:
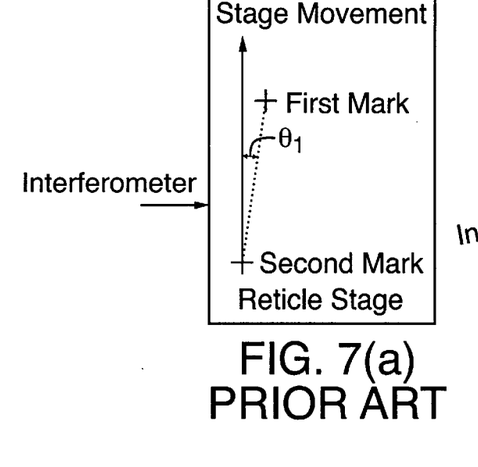
FIGS. 7(a)–7(c) depict aspects of respective steps in a conventional method for detecting an amount of angular displacement of the reticle stage relative to the substrate stage.
Figure 7B:
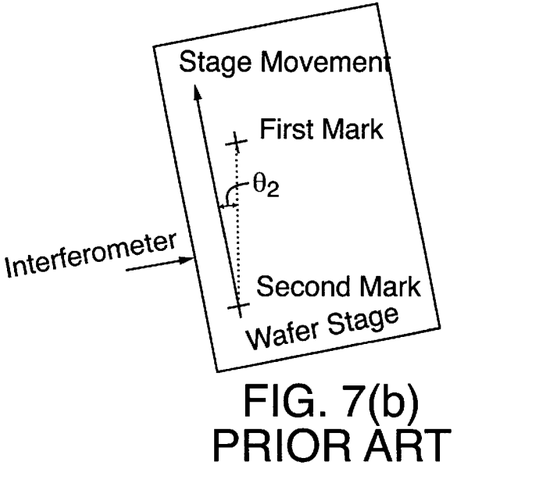

In one conventional alignment method, an electron beam is used to determine one or more of the foregoing positional relationships using index marks on the reticle stage or the reticle itself, and corresponding index marks (fiducial marks) on the substrate stage or on the substrate itself. The positions of the reticle stage and substrate stage relative to each other are detected from a backscattered-electron (BSE) signal produced by scanning an electron beam, that has passed through an index mark on the reticle or reticle stage, over a corresponding fiducial mark(s) on the substrate or substrate stage. An amount of relative angular displacement (rotation) of the direction of travel of the reticle stage relative to the direction of travel of the substrate stage is determined, e.g., by detecting the relative positions of two separated marks, as shown in FIGS. 7(a)–7(b).

More specifically, in the conventional method, the substrate stage is moved to a position at which the marks can be detected (i.e., a position at which a BSE signal from the substrate or substrate stage can be detected), and the substrate stage is held stationary at that position. Next, the reticle stage is moved to a respective position allowing detection of the first mark on the reticle or reticle stage (i.e., a position at which the first mark can be illuminated by the electron beam, which propagates through the first mark to a respective fiducial mark on the substrate or substrate stage), and the position of the first mark is detected. Then, the reticle stage and substrate stage are moved to respective positions allowing detection of the second mark on the reticle or reticle stage (i.e., a position at which the second mark can be illuminated by the electron beam, which propagates through the second mark to a respective fiducial mark on the substrate or substrate stage), and the position of the second mark is detected. During detection of the first and second marks, the respective positions of the reticle stage and substrate stage are monitored and detected using respective interferometers. Using data obtained by the reticle-stage interferometers for reference, an angle $\theta_1$ of rotation between the direction of travel of the reticle stage and a straight line connecting the two marks on the reticle stage (or reticle) is calculated from the detected amounts of movement of the reticle stage and the respective detected positions of the two marks (FIG. 7(a)). Similarly, using data obtained by the substrate-stage interferometers for reference, an angle $\theta_2$ of rotation between the direction of travel of the substrate stage and a straight line connecting the two marks on the substrate stage (or substrate) is calculated (FIG. 7(b)).

Figure 7C:
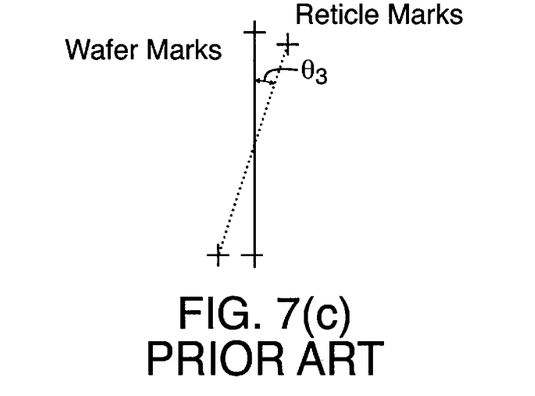

Then, the reticle stage is moved to place the two marks on the reticle stage (or reticle) within a primary deflection range of the electron beam. The reticle stage then is stopped. Similarly, the substrate stage is moved to place the two marks on the substrate stage (or substrate) within the primary deflection range. With the stages in their respective positions, mark detections are performed to determine the positional relationship between the first and second marks on the reticle stage (or reticle) and the first and second marks on the substrate stage (or substrate). An angle of rotation $\theta_3$ between a straight line connecting the first and second marks on the reticle stage (or reticle) and a straight line connecting the first and second marks on the substrate stage (or substrate) is ascertained from the results of these calculations. By combining these results with the results summarized above, the relative rotation between the direction of travel of the reticle stage and the direction of travel of the substrate stage is determined (FIG. 7(c)).

From the foregoing method, by which respective marks on the stages are aligned relative to the directions of travel of the respective stages, rotation amounts are calculated between the reticle and the direction of travel of the reticle stage, and between the substrate and the direction of travel of the substrate stage. Respective rotations in the substrate and reticle can be calculated from these results.

Because the alignment method summarized above includes respective movements of the two stages to place the two marks within the main deflection range of the electron beam to perform mark detection, several problems arise. The first problem is that mark detection is performed by deflecting the beam. This is not a problem whenever the measurement equipment is adjusted adequately and sufficient accuracy is achieved at whatever position to which the beam is deflected. However, an electron-optical system normally is not always adjusted adequately. For example, adjustment normally is inadequate whenever the apparatus is first turned on. In such a situation, accurate mark detection must be performed with the respective marks situated at a position at which the beam is not deflected (i.e., at the axis of the optical system). This is because the accuracy of mark detection is poor whenever mark detection is performed with the respective marks situated at a beam-deflection position.

The second problem is that, whereas calculation of relative rotations is made by performing a mark-position calculation for each of the detected marks, if the calculation is performed simply to make an alignment bringing the relative rotation amount to zero, and not to obtain a measurement of the actual amount of rotation, then calculating the actual amount of rotation for each mark must be performed repeatedly, which is extremely inefficient.

SUMMARY OF THE INVENTION

In view of the shortcomings of the prior art as summarized above, an object of the invention is to provide a charged-particle-beam (CPB) microlithography apparatus capable of detecting an amount of relative rotation between the transfer-receiving side (e.g., substrate side) and the transfer-originating side (e.g., reticle side) simply by detecting marks that are disposed near the axis of the optical system. Another object is to provide semiconductor-manufacturing methods utilizing such CPB microlithography apparatus.

To such end, and according to a first aspect of the invention, methods are provided, in the context of a charged-particle-beam (CPB) microlithography method, for determining an amount of relative rotation between the substrate (or substrate stage) and the reticle (or reticle stage). In an embodiment of such a method, at least one index mark on the substrate or substrate stage is provided. Each index mark is configured to produce an amount of backscattered charged particles, whenever the index mark is irradiated by a charged particle beam, that is measurably different from a baseline amount of backscattered charged particles. The at least one index mark has a predetermined orientation relative to an alignment axis of the substrate or substrate stage. Also, at least one alignment mark is provided on the reticle or reticle stage. Each alignment mark has a configuration corresponding to the configuration of one or more respective index marks on the substrate, and has a predetermined orientation relative to an alignment axis of the reticle or reticle stage. The at least one index mark is irradiated with a charged particle beam that has passed through the corresponding alignment mark. Amounts of backscattered charged particles produced by each irradiated index mark are detected so as to produce a corresponding electrical signal. The electric signal is processed to determine the amount of relative orientation.

Hence, the charged particle beam, after having passed through the corresponding alignment mark on the reticle (or reticle stage), propagates to respective index mark(s) on the substrate (or substrate stage). The index marks desirably are located near the axis of the CPB optical system, and desirably are configured such that quantities of charged particles backscattered from the marks vary with changes in the relative rotational alignment of the reticle and substrate. Such measurements can be made with only a single scan of the beam.

Typically, the index marks are configured to produce different amounts of backscattered charged particles than a "baseline" level produced, for example, by substrate material surrounding the marks.

Desirably, at least first and second index marks are provided on the substrate (or substrate stage). The first index mark produces an amount of backscattered charged particles that is greater than baseline, and the second index mark produces an amount of backscattered charged particles that is less than baseline. The respective amounts of backscattered charged particles produced by the first and second index marks desirably cancel each other whenever the reticle and substrate are aligned with each other. I.e., under conditions of reticle-substrate alignment, there desirably is no net increase or decrease of backscattered charged particles relative to baseline.

By way of example, the first index mark has a convex elevational profile. In such a situation, the second index mark desirably has a concave elevational profile. With such a configuration, the respective amounts of backscattered charged particles produced by the first and second index marks cancel each other whenever the reticle and substrate are aligned exactly with each other. Such mark configurations allow the first and second marks to be made of the same material. By forming the first mark as convex and the second mark as concave, the amount of charged particles produced by the marks can be decreased and increased, respectively, relative to the surrounding area.

The net amount of charged particles produced by the first and second index marks increases with increases in the relative rotational displacement between the reticle and substrate. Similarly, the net amount of charged particles produced by the first and second marks decreases with decreases in the relative rotational displacement between the reticle and substrate.

By way of another example, the first index mark is formed of a substance having a higher molecular weight than material surrounding the first index mark. In such a situation, the second index mark is formed of a substance having a lower molecular weight than material surrounding the second index mark. The respective amounts of backscattered charged particles produced by the first and second index marks desirably cancel each other whenever the reticle and substrate are aligned exactly with each other.

More generally, the sum of backscattered charged particles produced by the first index mark and of backscattered charged particles produced by the second index mark desirably is approximately equal to an amount of backscattered charged particles produced by material surrounding the first and second index marks whenever the reticle and substrate are aligned exactly with each other.

The first and second index marks can comprise a first set of index marks. In such a configuration, the first set of index marks is arranged at a first orientation angle relative to the alignment axis of the substrate or substrate stage. The first set of index marks is irradiated by scanning the charged particle beam over the first set. A second set of index marks also can be provided, wherein the second set comprises respective first and second index marks. In such a configuration, the second set of index marks is arranged at a second orientation angle, different from the first orientation angle, relative to the alignment axis of the substrate or substrate stage. The second set of index marks is irradiated by scanning the charged particle beam over the first and second sets.

The first and second index marks can comprise a first set of index marks in which the first and second index marks are arranged at an angle $\theta_{w1}$ relative to each other, wherein a line parallel to the alignment axis of the substrate bisects the angle $\theta_{w1}$. In such a configuration, first and second alignment marks, arranged at an angle $\theta_r$ relative to each other, are provided on the reticle or reticle stage, wherein the charged particle beam passes simultaneously through the first and second alignment marks. A line parallel to the alignment axis of the reticle bisects the angle $\theta_r$. The first set of index marks is irradiated by scanning the charged particle beam over the first set. Furthermore, a second set of index marks can be provided, in which respective first and second index marks are arranged relative to each other at an angle $\theta_{w2}$ that is different from the angle $\theta_{w1}$, wherein the line parallel to the alignment axis of the substrate bisects the angles $\theta_{w2}$ and $\theta_{w1}$. In such a method, the first and second sets of index marks are irradiated by scanning the charged particle beam over the first and second sets.

The foregoing and additional features and advantages of the invention will be more readily apparent from the following detailed description, which proceeds with reference to the accompanying drawings.

DETAILED DESCRIPTION

Figure 1A:
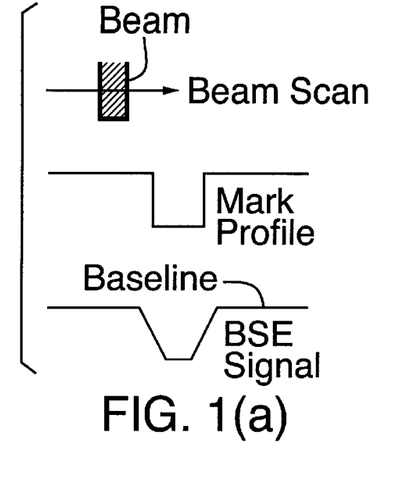
FIGS. 1(a)–1(b) depict certain general principles applicable to any of various representative embodiments of a method, according to the invention, in which marks on the substrate are irradiated with a charged particle beam.
Figure 1B:
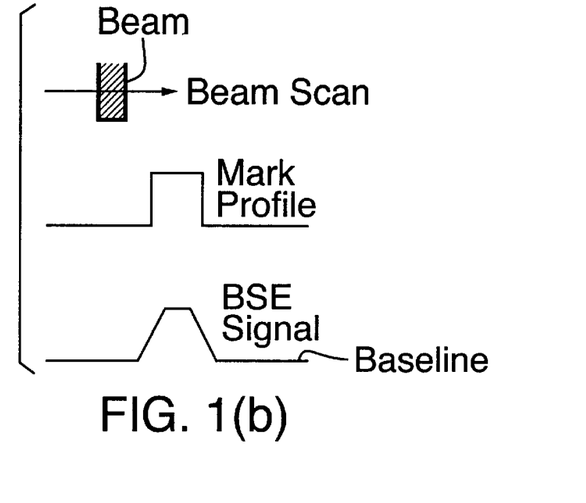

FIGS. 1(a)–1(b) depict certain general principles applicable to any of various representative embodiments of a method, according to the invention, in which at least one mark (termed herein an "index mark") on the substrate is irradiated with a charged particle beam. Specifically, the beam is scanned over an index mark having an elevational concave profile (FIG. 1(a)) and over an index mark having an elevational convex profile (FIG. 1(b)). The beam that is scanned over the index marks has already passed through corresponding alignment mark(s) on the reticle (or reticle stage). In the index mark of FIG. 1(a), when viewed as an elevational section, the mark features extend below the plane of the substrate (thus the index mark is "concave"). In the index mark of FIG. 1(b), when viewed as an elevational section, the mark features extend above the plane of the substrate (thus the index mark is "convex"). A respective backscattered-particle (BSE) signal is produced from each index mark as the respective mark is irradiated. In FIG. 1(a), the BSE signal has a negative amplitude relative to the signal produced by the surface plane of the substrate. I.e., the BSE signal amplitude is less than a "baseline" signal produced by the surface plane of the substrate. In FIG. 1(b), the BSE signal has a positive amplitude relative to the signal produced by the surface plane of the substrate. I.e., the BSE signal amplitude is greater than the "baseline" signal. Thus, each index mark produces a BSE signal that is "measurably different" from the baseline signal.

The profiles of BSE signals shown in FIGS. 1(a)–1(b) are exploited in various embodiments of the invention. I.e., the relative profiles provide information regarding rotational displacement of the reticle and substrate relative to each other, and the angle of displacement of the reticle and substrate relative to each other can be reduced to zero by monitoring the profiles and making any necessary adjustments to such end. More specifically, in this embodiment, a concave index mark and a convex index mark are disposed on the substrate. The index marks are disposed so that the sum of the BSE signals produced by the marks is "flat" (i.e., unchanged from the "baseline" profile) whenever the rotation angle between the reticle and the substrate is zero.

Figure 2A:
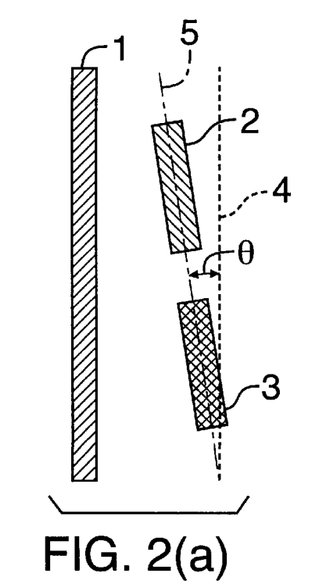
FIGS. 2(a)–2(b) depict an arrangement of marks and associated net BSE signal, respectively, according to a first representative embodiment of the invention.

According to a first representative embodiment, an exemplary arrangement of index marks is shown in FIG. 2(a). Item 1 is a transverse profile of a charged particle beam, item 2 is a representative convex mark, item 3 is a representative concave mark, and item 4 is a line extending parallel to the longitudinal axis of the transverse profile of the charged particle beam 1. The beam 1 is caused to scan (sweep) over the convex mark 2 and the concave mark 3.

The depicted transverse profile (FIG. 2(a)) of the beam 1 is produced by passage of the charged particle beam through a corresponding alignment mark in the reticle. Then, the line 4 is parallel to an alignment axis of the reticle.

In this embodiment, the index marks 2, 3 are arranged on the substrate, along a line 5 parallel to an alignment axis of the substrate. Thus, the index marks 2, 3 are used to indicate the orientation of the line 5 relative to the line 4; i.e., the substrate and the reticle relative to each other. After passing through the reticle, the beam 1 propagates to and is swept over the convex mark 2 and concave mark 3 on the substrate. In this embodiment, the index marks 2, 3 have the same shape and are arrayed along the line 5. The angle between the lines 4 and 5 is denoted θ. Desirably, the difference in the reduced quantity of backscattered particles produced by the concave mark 2 relative to baseline and the difference in the increased quantity of backscattered particles produced by the convex mark 3 relative to baseline essentially are equal to each other. I.e., referring to FIG. 2(b), the area of the curve above baseline desirably is equal to the area of the curve below baseline.

In a situation in which θ=0 (which occurs whenever the reticle is oriented exactly with the substrate, wherein the line 5 is exactly parallel with the line 4), the increased amount of backscattered particles produced as the beam 1 scans the convex mark 2 and the decreased amount of backscattered particles produced as the beam 1 scans the concave mark 3 exactly cancel each other. As a result, the detected net quantity of backscattered particles is unchanged relative to the baseline level (FIG. 2(b)). In contrast, whenever θ does not equal zero (e.g., as shown in FIG. 2(a), the line 5 is tilted left relative to the line 4), one of the index marks 2, 3 is irradiated before the other index mark. (E.g., as shown in FIG. 2(a), the convex mark 2 is irradiated by the beam 1 first, followed by illumination of the concave mark 3). In such an instance, the BSE signal produced by the BSE detector exhibits a transient skew relative to the baseline as the beam scans over the index marks 2, 3 (e.g., see FIG. 2(b)). From the skewed profile, orientation or degree of mis-orientation of the reticle and substrate relative to each other can be determined. I.e., the angle θ of the reticle and substrate relative to each other can be determined from an analysis of the BSE-detector output (e.g., output magnitude, signal-waveform amplitude, etc.).

Figure 2B:
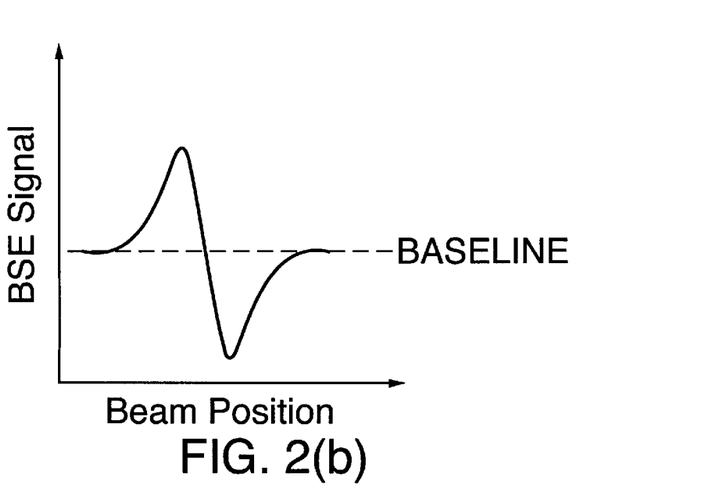

It is possible to align the reticle and substrate in real time using the BSE-detector output signal. For example, the reticle-substrate orientation can be adjusted while observing the signal waveform (e.g., as shown in FIG. 2(b)), and such adjustment is continued until the baseline waveform is obtained.

According to the same principle, rather than a single set of index marks (in which each set includes one concave mark 3 and one convex mark 2), multiple sets of marks can be swept using the charged particle beam 1. For example, a first set of index marks can have a respective connecting line 5a that is oriented exactly with an orientation axis 4 of the substrate, a second set of index marks can have a respective connecting line 5b that is at a first angle to the orientation axis 4 of the substrate, a third set of index marks can have a respective connecting line 5c that is at a second angle (slightly greater than the first angle) to the orientation axis 4 of the substrate, and so on. With such an arrangement of index marks, the angle θ between the orientation axis of the reticle and the orientation axis of the substrate can be detected by scanning the multiple sets of index marks using the charged particle beam 1. The actual reticle-substrate angular orientation can be determined readily from the profile of the BSE signal using a single measurement.

In the discussion above, the subject index marks are defined by corresponding "irregularities" (i.e., convex projections or concave depressions) in the surface of the substrate. Alternatively, the index marks can be defined by local units of material on the substrate exhibiting a greater or lesser amount, respectively, of backscattering of charged particles than the substrate material (the substrate material usually is silicon).

Materials producing a greater amount of backscattered charged particles typically have a higher molecular weight than the substrate material. Representative higher-molecular-weight materials are tungsten and molybdenum. To define an index mark, a correspondingly patterned layer of the higher-molecular-weight material is applied to or formed on the surface of the substrate. In addition to selecting an appropriate higher-molecular-weight material, further manipulation of the amount of charged particles backscattered from the index mark can be obtained by controlling the thickness of the higher-molecular-weight material on the substrate surface. Usually, the higher-molecular-weight material is applied as a "thin film" having a thickness in the range of approximately 1 μm. Generally, the greater the thickness of the film, the greater the amount of backscattered charged particles produced by the film at a given beam dose.

Materials producing a lesser amount of backscattered charged particles typically have a lower molecular weight than the substrate material. A representative lower-molecular-weight material is carbon. To define an index mark, a correspondingly patterned layer of the lower-molecular-weight material is applied to or formed on the substrate surface. In addition to selecting an appropriate lower-molecular-weight material, further manipulation of the amount of charged particles backscattered from the mark can be obtained by controlling the thickness of the lower-molecular-weight material on the substrate surface. Usually, the lower-molecular-weight material is applied as a "thin film" having a thickness in the range of approximately 1 μm. As noted above, the greater the thickness of the film, the greater the amount of backscattered charged particles produced by the film at a given beam dose.

Figure 3A:
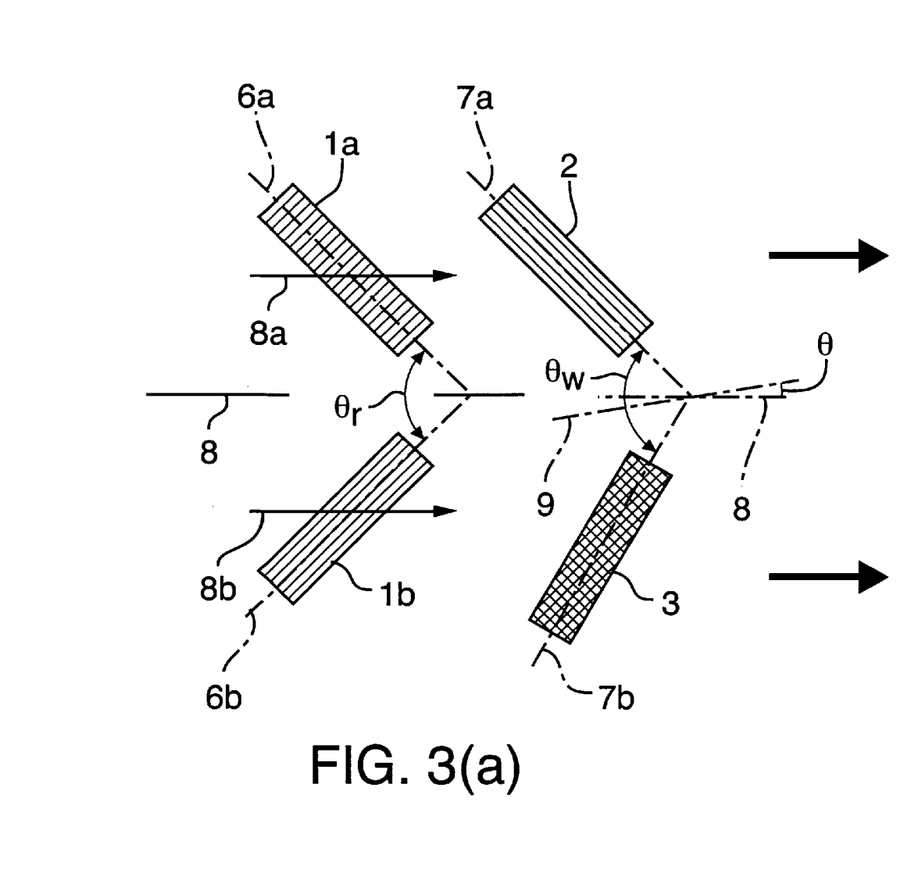
FIGS. 3(a)–3(b) depict an arrangement of marks and associated BSE signals, respectively, according to a second representative embodiment of the invention.
Figure 3B:
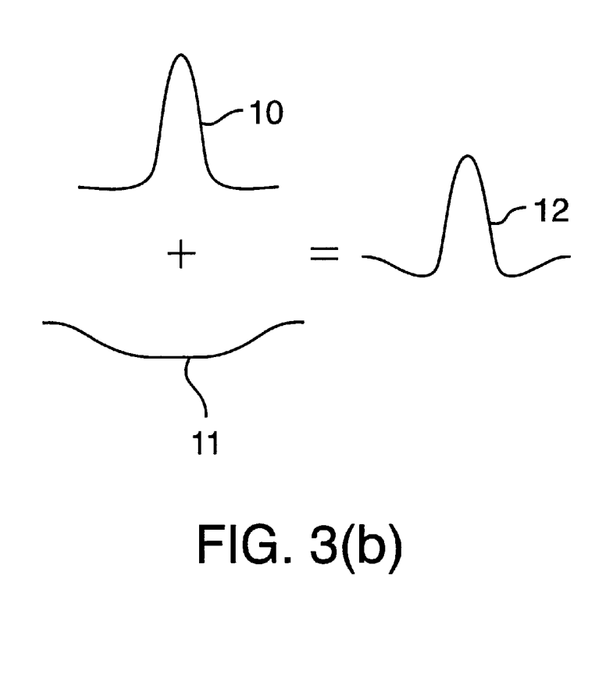

A second representative embodiment is depicted in FIGS. 3(a)–3(b). In FIGS. 3(a)–3(b), components that are the same as corresponding components in FIG. 2(a) have the same respective reference numerals. In this second representative embodiment, an incident charged particle beam is configured as two beams 1a, 1b as a result of passage of the charged particle beam through corresponding marks in the reticle. By way of example, each beam 1a, 1b has a rectangular transverse profile. The beam 1a is aligned with a line 6a, and the beam 1b is aligned with a line 6b. The lines 6a, 6b are at an angle $θ_r$ relative to each other as shown in the figure. In this embodiment, the angle $θ_r$ is bisected by a line 8 representing an alignment axis of the reticle. The beams 1a, 1b are scanned together (arrows 8a, 8b, respectively). A rectangular convex index mark 2 and a rectangular concave index mark 3 are disposed on the substrate. The convex mark 2 has a longitudinal axis 7a, and the concave mark 3 has a longitudinal axis 7b. The longitudinal axes 7a, 7b have an angle $θ_w$ between them, which need not be equal to $θ_r$. A line 9, that bisects the angle $θ_w$ in this embodiment, represents an orientation axis of the substrate.

The charged particle beams 1a, 1b are scanned together (arrows 8a, 8b) over the index marks 2, 3, respectively. If the line 9 is colinear with the line 8 (i.e., if the reticle orientation is the same as the substrate orientation), then scanning the beams 1a, 1b over the index marks 2, 3 results in a net BSE signal exhibiting no significant change from baseline. That is, the amount of particles backscattered from the index mark 2 and the amount of particles backscattered from the index mark 3 cancel each other.

If the line 9 is not exactly colinear with the line 8, then canceling of the BSE signals does not occur. For example, as shown in FIG. 3(a), if the beam 1a has the same orientation as the convex mark 2 but the beam 1b has a different orientation than the concave mark 3, then the backscattered particles from the convex mark 2 produce a sharply peaked signal 10 as the electron beam 1a is scanned over the mark. Meanwhile, the backscattered particles produced by scanning the beam 1b over the concave mark 3 produce a BSE particle signal 11 shaped as a gentle trough. The net BSE signal 12 is shown in FIG. 3(b).

The angle θ between the line 8 (orientation line of the reticle) and the line 9 (orientation line of the substrate) can be calculated as:

$$θ=(θ_w-θ_r)/2$$

The amplitude of the net signal is negative if the angle orientations are reversed from what is described above. Nevertheless, the angle of deviation likewise can be calculated.

Figure 4A:
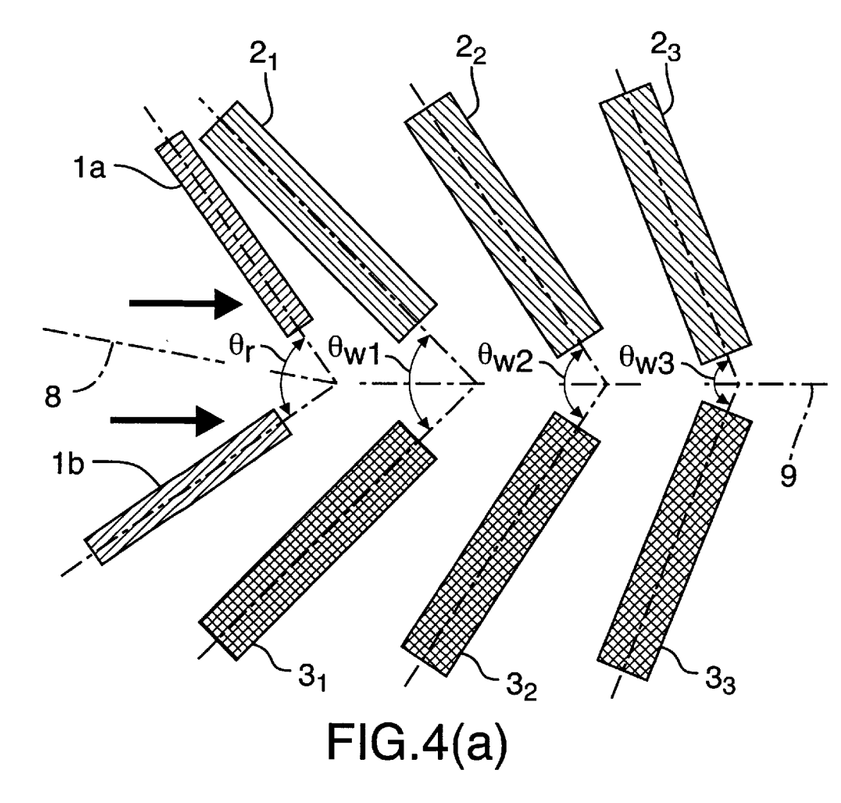
FIGS. 4(a)–4(b) depict an arrangement of marks and associated BSE signals, respectively, according to a third representative embodiment of the invention.

The substrate can include multiple sets of the convex index marks 2 and concave index marks 3. Each set includes at least one of each type of mark 2, 3, but each set desirably has a slightly different angle $\theta_w$. FIG. 4(a) is a depiction of an exemplary arrangement of multiple sets of index marks 2, 3. The marks in the first set are denoted $2_1$ and $3_1$, the marks in the second set are denoted $2_2$ and $3_2$, and the marks in the third set are denoted $2_3$ and $3_3$. The marks $2_1$–$2_3$ are "convex" marks, and the marks $3_1$–$3_3$ are "concave" marks. In FIG. 4(a), the charged particle beams are denoted by 1a and 1b having an angle $\theta_r$ therebetween. In this embodiment, the angle $\theta_r$ is bisected by a line 8 representing an alignment axis of the reticle. The angle between opposing index marks $2_1$, $3_1$ is $\theta_{w1}$, the angle between opposing index marks $2_2$, $3_2$ is $\theta_{w2}$, and the angle between opposing index marks $2_3$, $3_3$ is $\theta_{w3}$. Desirably, each of the angles $\theta_{w1}$, $\theta_{w2}$, $\theta_{w3}$ is different from the other. The angle $\theta_r$ between the beams 1a, 1b can be the same as one of the angles $\theta_{w1}$–$\theta_{w3}$, or different from any of the angles $\theta_{w1}$–$\theta_{w3}$. In this embodiment, each angle $\theta_{w1}$–$\theta_{w3}$ is bisected by a line 9 representing an alignment axis of the substrate. Thus, each set of convex and concave marks 2, 3 is oriented to the orientation axis of the substrate.

If the orientation of the array of beams 1a, 1b (i.e., the reticle orientation represented by the line 8) matches the orientation of the array of marks $2_1$ and $3_1$, $2_2$ and $3_2$, and $2_3$ and $3_3$ (i.e., the substrate orientation represented by the line 9), then the respective quantities of backscattered particles emitted from the convex marks $2_1$–$2_3$ and from the concave marks $3_1$–$3_3$ cancel each other out, yielding a net BSE signal that is not significantly different from the baseline BSE signal produced by the surface of the substrate. I.e., the net BSE signal is "flat."

Figure 4B:
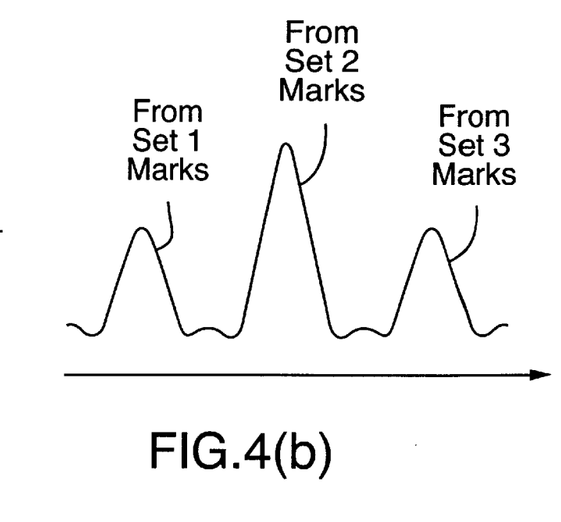

Next, a situation is considered in which the orientation of the array of beams 1a, 1b (i.e., the reticle orientation) differs from the orientation of the substrate, but the convex mark $2_2$ of the second set has the same orientation as the beam 1a. In such a situation, as shown in FIG. 4(b), the net signal produced by backscattered particles emitted from the various groups of index marks will be greatest from the second set comprising the convex mark $2_2$ and the concave mark $3_2$. In this situation, the angle $\theta$ between the reticle orientation (line 8) and the substrate orientation (line 9) is calculated as:

$$\theta=(\theta_{w2}-\theta_r)/2$$

The value of the net signal is negative if the orientation of the angle $\theta$ is reversed. Thus, the angle of deviation likewise can be calculated under such conditions.

In the embodiments shown in FIGS. 3(a)–3(b) and 4(a)–4(b), the index marks $2_1$–$2_3$, $3_1$–$3_3$ are defined as corresponding irregularities (convex or concave) in the surface of the substrate. Alternatively, as discussed above in the context of the first representative embodiment, the index marks can be defined by localized units of material on the substrate exhibiting a greater or lesser amount of backscattering of charged particles than the substrate material.

In any of the various embodiments of this invention involving multiple marks, the amount of relative rotational displacement of the reticle and substrate can be determined not only during real-time correction of the displacement but also while making alignments of the reticle and substrate.

Although the embodiments discussed above were in the context of alignments between the reticle and the substrate, the invention similarly can be applied to alignments between the reticle stage and the substrate, between the reticle and the substrate stage, and between the reticle stage and the substrate stage.

Figure 5:
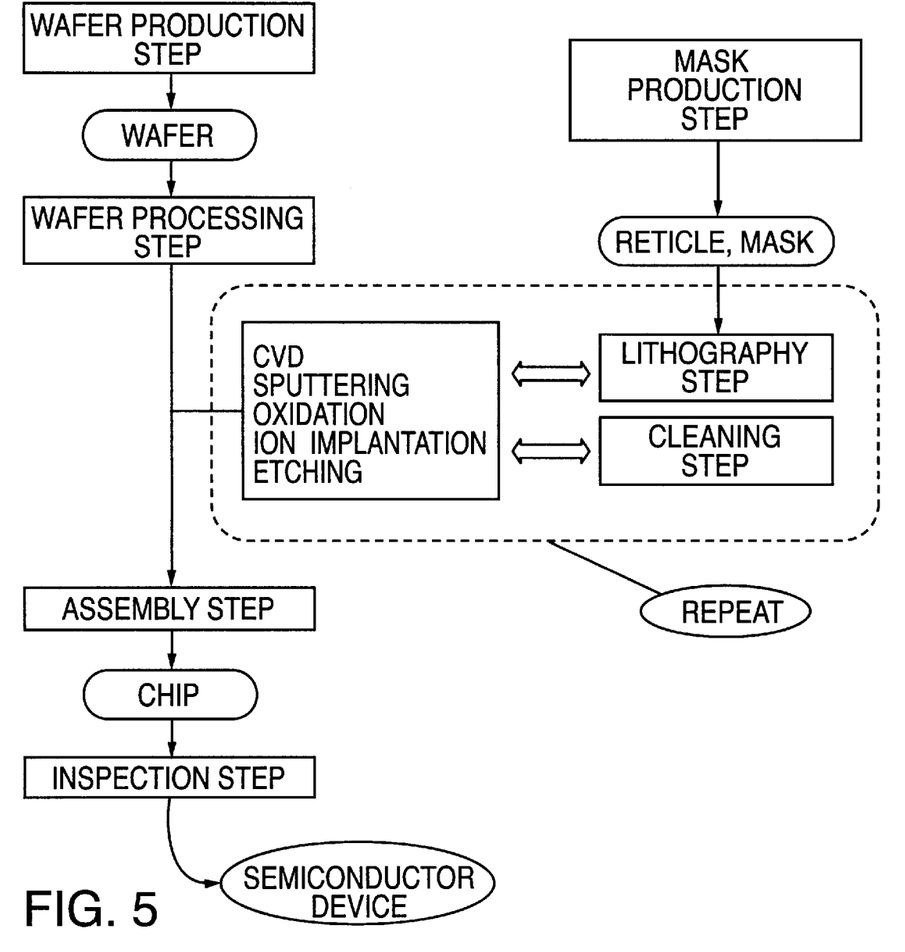
FIG. 5 is a process flowchart for manufacturing a semiconductor device, wherein the process includes a microlithography method according to the invention.

FIG. 5 is a flowchart of an exemplary semiconductor fabrication method to which apparatus and methods according to the invention readily can be applied. The fabrication method generally comprises the main steps of wafer production (wafer fabrication and preparation), reticle production (reticle fabrication and preparation), wafer processing, device (chip) assembly (including dicing, lead connections, and packaging), and device inspection. Each step usually comprises several sub-steps.

Among the main steps, wafer (substrate) processing is key to achieving the smallest feature sizes (critical dimensions) and best inter-layer registration. In the wafer-processing step, multiple circuit patterns are layered successively atop one another on the wafer, wherein the formation of each layer typically involves multiple sub-steps. Usually, many operative semiconductor devices (e.g., memory chips or CPUs) are produced on each wafer.

Typical wafer-processing steps include: (1) thin-film layer formation involving formation of a dielectric layer for electrical insulation or a metal layer for forming interconnects and electrodes; (2) oxidation of the thin-film layer or wafer substrate; (3) microlithography to form a resist pattern, for selective processing of the thin film or the substrate itself, according to a reticle; (4) etching or analogous step to etch the thin film or substrate according to the resist pattern; (5) impurity doping or implantation (e.g., by ion bombardment or diffusion) as required to implant ions or impurities into the thin film or substrate according to the resist pattern; (6) resist stripping to remove the resist from the wafer; and (7) wafer inspection. Wafer processing is repeated as required (typically many times) to fabricate the desired semiconductor chips on the wafer.

Figure 6:
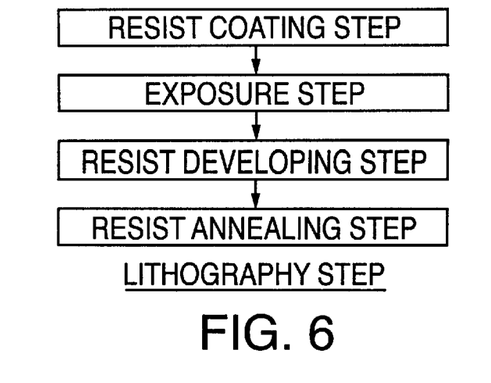
FIG. 6 is a process flowchart for performing a microlithography method that includes a projection-exposure method according to the invention.

FIG. 6 provides a flow chart of typical steps performed in microlithography, which is a principal step in wafer (substrate) processing. The microlithography step typically includes: (1) resist-coating step, wherein a suitable resist is coated on the wafer or wafer substrate (which can include a circuit element formed in a previous wafer-processing step; (2) exposure step, to expose the resist with the desired pattern; (3) development step, to develop the exposed resist; and (4) optional resist-annealing step, to enhance the durability of the resist pattern.

Using a charged-particle-beam (CPB) microlithography apparatus according to the invention allows accurate alignment to be performed, even before CPB deflection adjustments have been completed. Also, since alignment can be completed in a short time, the production efficiency of semiconductor devices is correspondingly improved.

Furthermore, because the marks desirably are disposed near the axis of the CPB-optical system, accurate alignments are possible even in CPB microlithography apparatus in which deflection properties have not been adjusted fully. In addition, the amount of relative rotational displacement between the substrate (or substrate stage) and the reticle (or reticle stage) can be found with a single scan.

Whereas the invention has been described in connection with several representative embodiments, it will be understood that the invention is not limited to those embodiments. On the contrary, the invention is intended to encompass all modifications, alternatives, and equivalents as may be included within the spirit and scope of the invention, as defined by the appended claims.

What is claimed is:

1. In a charged-particle-beam (CPB) microlithography method for transfer-exposing a pattern, defined on a reticle mounted on a reticle stage, to a sensitive substrate made of a substrate material and mounted on a substrate stage, a method for determining an amount of relative rotation between the substrate or substrate stage and the reticle or reticle stage, the method comprising:

(a) providing at least one index mark on the substrate or substrate stage, each index mark being configured to produce an amount of backscattered charged particles, whenever the index mark is irradiated by a charged particle beam, that is measurably different from a baseline amount of backscattered charged particles, the at least one index mark having a predetermined orientation relative to an alignment axis of the substrate or substrate stage;

(b) providing at least one alignment mark on the reticle or reticle stage, each alignment mark having a configuration corresponding to the configuration of one or more respective index marks on the substrate, and having a predetermined orientation relative to an alignment axis of the reticle or reticle stage;

(c) irradiating the at least one index mark with a charged particle beam that has passed through the corresponding alignment mark;

(d) detecting amounts of backscattered charged particles produced by each irradiated index mark to produce a corresponding electrical signal; and (e) processing the electrical signal to determine the amount of relative orientation.

2. The method of claim 1, wherein the baseline amount is produced by regions of the substrate or substrate stage surrounding the at least one index mark.

3. The method of claim 1, wherein:

step (a) comprises providing first and second index marks on the substrate or substrate stage; and the first index mark produces an amount of backscattered charged particles that is greater than the baseline amount, and the second index mark produces an amount of backscattered charged particles that is less than the baseline amount.

4. The method of claim 3, wherein the respective amounts of backscattered charged particles produced by the first and second index marks cancel each other whenever the reticle and substrate are aligned with each other.

5. The method of claim 3, wherein the first index mark has a convex elevational profile.

6. The method of claim 5, wherein:

the second index mark has a concave elevational profile; and the respective amounts of backscattered charged particles produced by the first and second index marks cancel each other whenever the reticle and substrate are aligned with each other.

7. The method of claim 3, wherein the second index mark has a concave elevational profile.

8. The method of claim 3, wherein the first index mark is formed of a substance having a higher molecular weight than material surrounding the first index mark.

9. The method of claim 8, wherein:

the second index mark is formed of a substance having a lower molecular weight than material surrounding the second index mark; and the respective amounts of backscattered charged particles produced by the first and second index marks cancel each other whenever the reticle and substrate are aligned with each other.

10. The method of claim 3, wherein the second index mark is formed of a substance having a lower molecular weight than material surrounding the second index mark.

11. The method of claim 3, wherein:

a sum of backscattered charged particles produced by the first index mark and backscattered charged particles produced by the second index mark is approximately equal to an amount of backscattered charged particles produced by material surrounding the first and second index marks.

12. The method of claim 3, wherein:

the first and second index marks comprise a first set of index marks;

the first set of index marks is arranged at a first orientation angle relative to the alignment axis of the substrate or substrate stage; and step (c) comprises irradiating the first set of index marks by scanning the charged particle beam over the first set.

13. The method of claim 12, wherein:

step (a) further comprises providing a second set of index marks, the second set comprising respective first and second index marks;

the second set of index marks is arranged at a second orientation angle, different from the first orientation angle, relative to the alignment axis of the substrate or substrate stage; and step (c) further comprises irradiating the second set of index marks by scanning the charged particle beam over the first and second sets.

14. The method of claim 3, wherein:

the first and second index marks comprise a first set of index marks in which the first and second index marks are arranged at an angle $\theta_{w1}$ relative to each other, wherein a line parallel to the alignment axis of the substrate bisects the angle $\theta_{w1}$;

step (b) comprises providing first and second alignment marks arranged at an angle $\theta_r$ relative to each other, wherein the charged particle beam passes simultaneously through the first and second alignment marks, and a line parallel to the alignment axis of the reticle bisects the angle $\theta_r$; and step (c) comprises irradiating the first set of index marks by scanning the charged particle beam over the first set.

15. The method of claim 14, wherein:

step (a) further comprises providing a second set of index marks in which the first and second index marks are arranged relative to each other at an angle $\theta_{w2}$ that is different from the angle $\theta_{w1}$, wherein the line parallel to the alignment axis of the substrate bisects the angles $\theta_{w2}$ and $\theta_{w1}$; and step (c) further comprises irradiating the first and second sets of index marks by scanning the charged particle beam over the first and second sets.

16. A CPB microlithography method, comprising the method of claim 1.

17. A semiconductor-device fabrication method, comprising the steps of:

(a) preparing a wafer;

(b) processing the wafer; and (c) assembling devices formed on the wafer during steps (a) and (b), wherein step (b) comprises a method for performing CPB microlithography as recited in claim 16.

18. A semiconductor device produced by the method of claim 17.

* * * * *